(12) United States Patent
Kamei et al.

(10) Patent No.: US 7,915,714 B2
(45) Date of Patent: Mar. 29, 2011

(54) SEMICONDUCTOR LIGHT EMITTING ELEMENT AND WAFER

(75) Inventors: Hidenori Kamei, Fukuoka (JP); Syuuichi Shinagawa, Kagoshima (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/298,664

(22) PCT Filed: Apr. 27, 2007

(86) PCT No.: PCT/JP2007/059562
§ 371 (c)(1), (2), (4) Date: Oct. 27, 2008

(87) PCT Pub. No.: WO2007/126158
PCT Pub. Date: Nov. 8, 2007

(65) Prior Publication Data
US 2009/0101936 A1    Apr. 23, 2009

(30) Foreign Application Priority Data

Apr. 27, 2006  (JP) ................... 2006-123258
Apr. 25, 2007  (JP) ................... 2007-115554

(51) Int. Cl.
*H01L 33/16* (2010.01)
(52) U.S. Cl. ............ 257/627; 257/E33.003; 438/33
(58) Field of Classification Search .......... 257/79, 257/E33.003, E33.002, 103; 438/22, 33
See application file for complete search history.

(56) References Cited

U.S. PATENT DOCUMENTS

| 5,627,109 | A | | 5/1997 | Sassa et al. | |
|---|---|---|---|---|---|
| 5,864,171 | A | * | 1/1999 | Yamamoto et al. | 257/628 |
| 5,972,730 | A | * | 10/1999 | Saito et al. | 438/39 |
| 2003/0001238 | A1 | * | 1/2003 | Ban | 257/627 |
| 2003/0205783 | A1 | * | 11/2003 | Ishida | 257/627 |
| 2004/0012958 | A1 | * | 1/2004 | Hashimoto et al. | 362/241 |

FOREIGN PATENT DOCUMENTS

| JP | 61-214421 | 9/1986 |
|---|---|---|
| JP | 2-275614 | 11/1990 |
| JP | 9-219560 | 8/1997 |
| JP | 2001-85736 | 3/2001 |
| JP | 2002-329684 | 11/2002 |
| JP | 2004-6662 | 1/2004 |
| JP | 2005-142391 | 6/2005 |

* cited by examiner

*Primary Examiner* — Matthew S Smith
*Assistant Examiner* — Michele Fan
(74) *Attorney, Agent, or Firm* — McDermott Will & Emery LLP

(57) ABSTRACT

There are provided a semiconductor light emitting element which allows an improvement in light extraction efficiency without increasing the number of fabrication steps, and a wafer. In a semiconductor light emitting element 1 formed by laminating a compound semiconductor layer 3 on a single crystal substrate, and dividing the single crystal substrate into pieces, the side faces 21 to 24 of each of substrate pieces 2 as the divided single crystal substrate are formed such that the side face 21 used as the reference of the substrate piece 2 forms an angle of 15° with respect to the (1-100) plane, and that the side faces 21 to 24 are formed of planes different from cleaved planes of a crystalline structure in the single crystal substrate.

4 Claims, 9 Drawing Sheets

FIG. 4
(A)
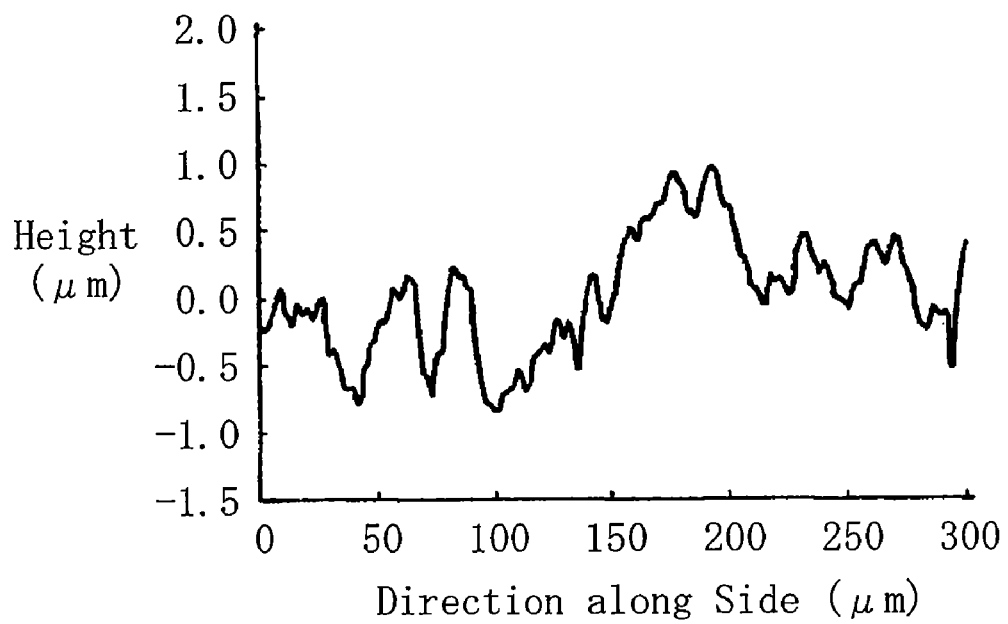
(B)
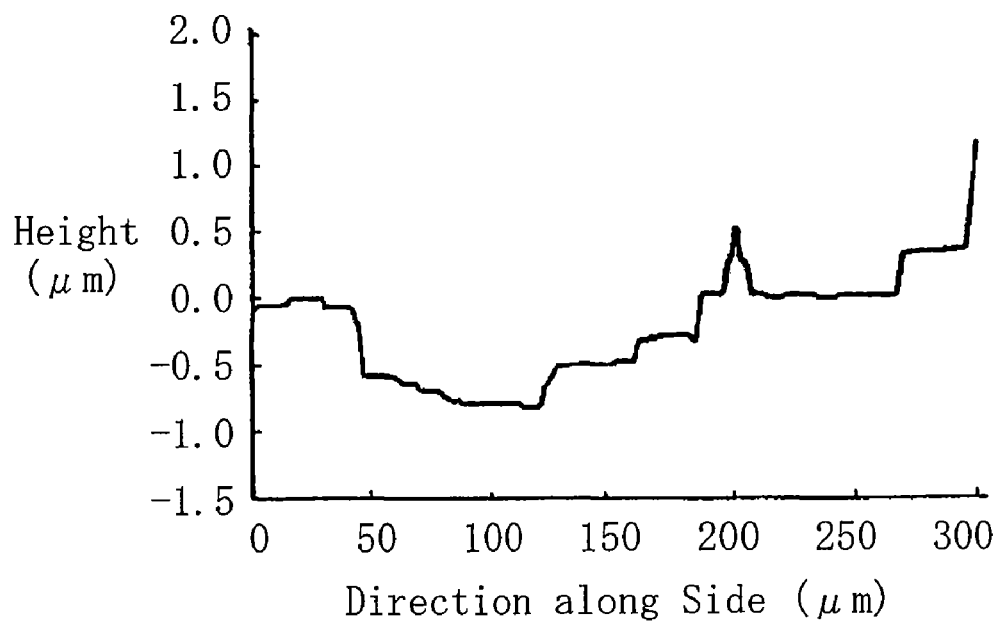

FIG. 6
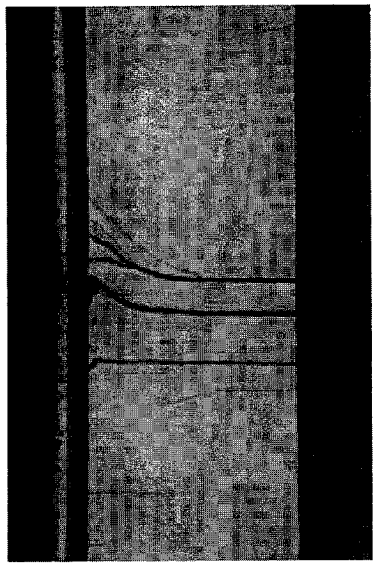
(C)
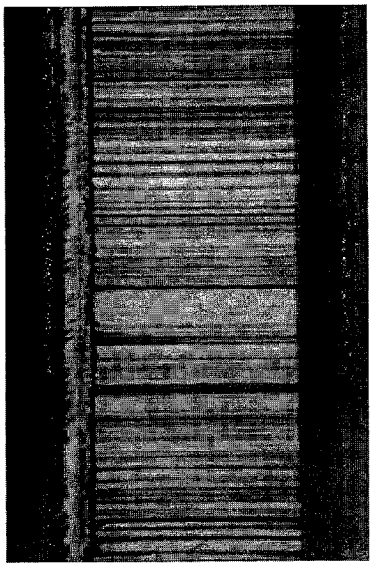
(D)
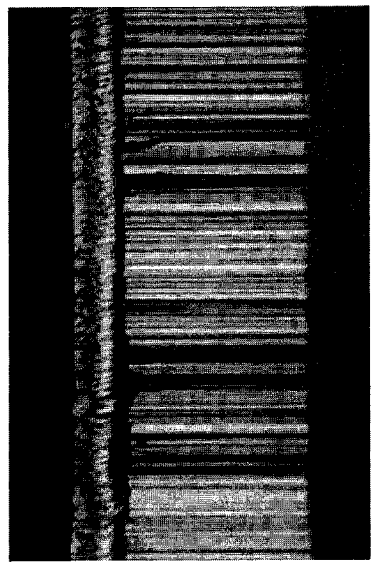
(A)
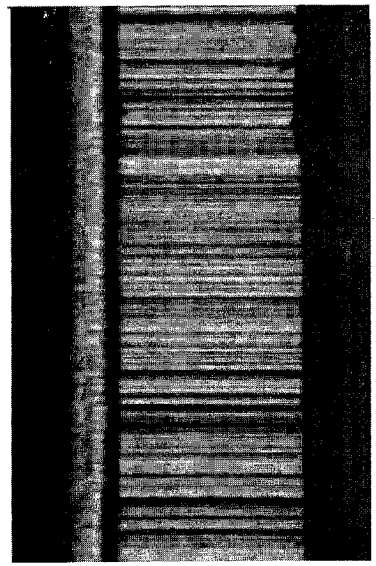
(B)

FIG. 9
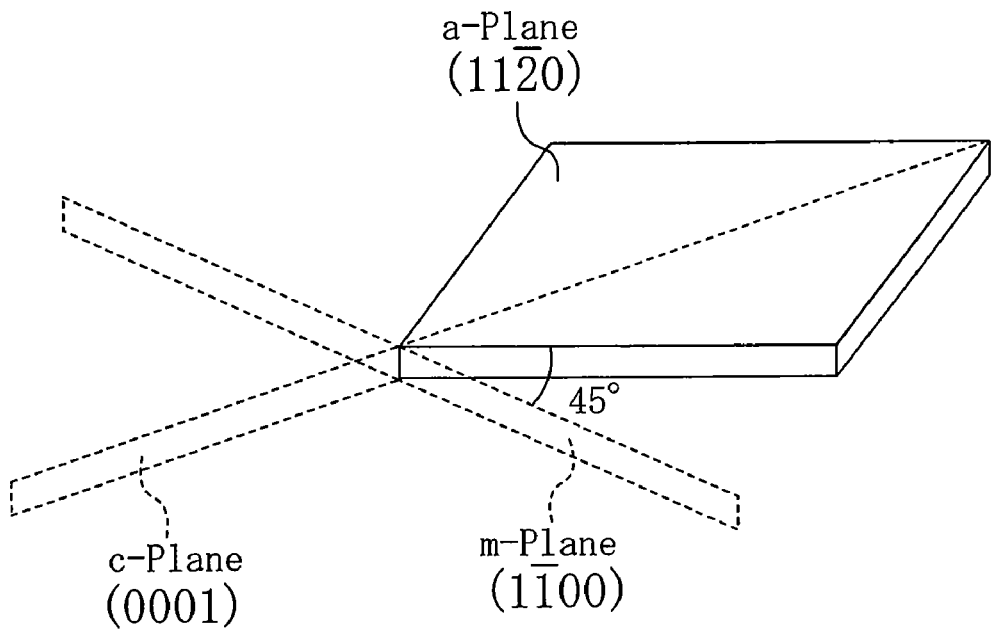
FIG. 10
(A)
(B)
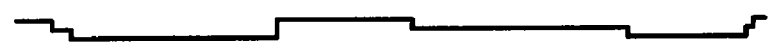

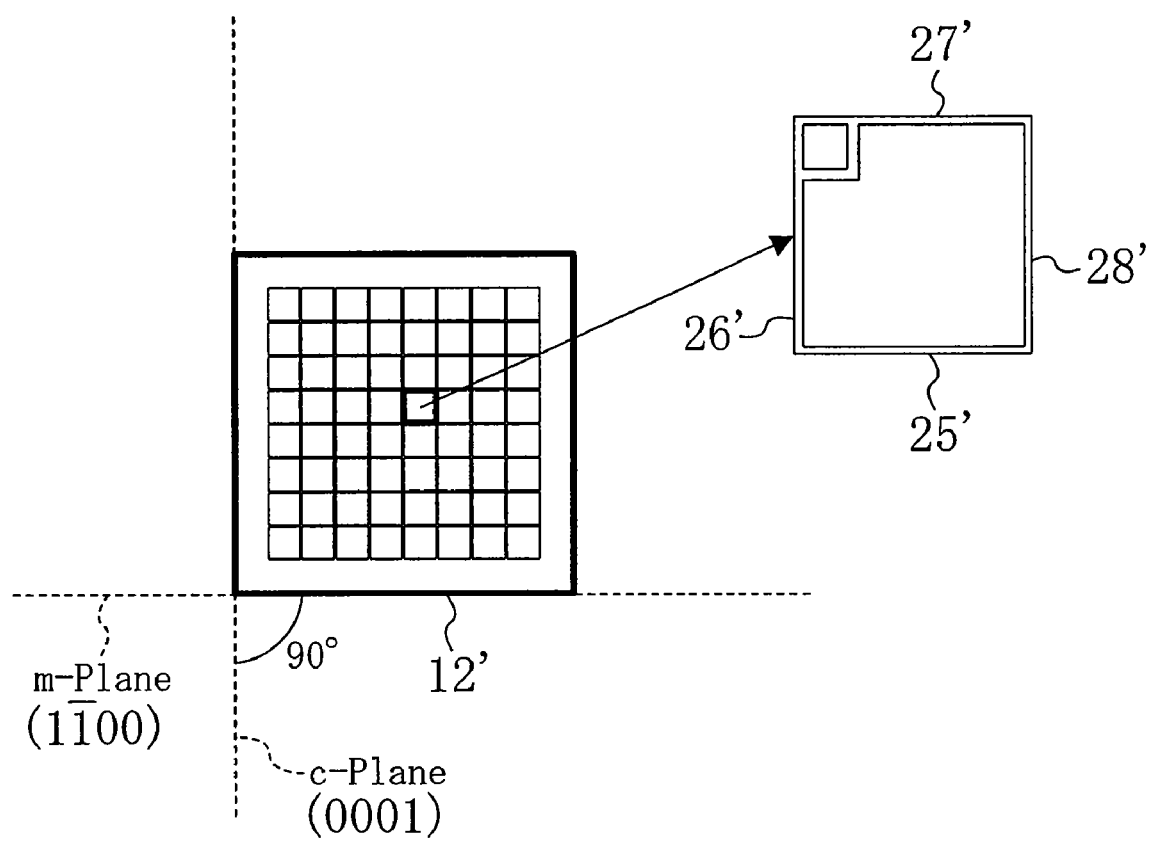

SEMICONDUCTOR LIGHT EMITTING ELEMENT AND WAFER

RELATED APPLICATIONS

This application is the U.S. National Phase under 35 U.S.C. §371 of International Application No. PCT/JP2007/059562, filed on Apr. 27, 2007, which in turn claims the benefit of Japanese Application No. 2006-123258 and Japanese Application No. 2007-115554, filed on Apr. 27, 2006 and Apr. 25, 2007 respectively, the disclosures of which Applications are incorporated by reference herein.

TECHNICAL FIELD

The present invention relates to a semiconductor light emitting element in which a compound semiconductor layer is laminated on a single crystal substrate, and to a wafer.

BACKGROUND ART

As a technology for increasing the efficiency of light extraction from a semiconductor light emitting element, and improving brightness, there is one described in Patent Document 1. In a gallium nitride-based compound semiconductor element described in Patent Document 1, the side faces of a substrate, or the side faces of the gallium nitride-based compound semiconductor element laminated on the substrate have been each formed into a concave and convex configuration by etching.

By thus forming the emission faces from which light is emitted into concave and convex faces, the degree to which light from the inside is totally reflected by the surfaces thereof can be reduced compared with the case where the emission faces are formed into flat and smooth faces, so that an improvement in light extraction efficiency is expected.

Patent Document 1: Japanese Laid-Open Patent Publication No. 2004-6662

DISCLOSURE OF THE INVENTION

Problems to be Solved by the Invention

However, in the gallium nitride-based compound semiconductor element described in Patent Document 1, the side faces of the substrate or the side faces of a gallium nitride-based compound semiconductor laminated on the substrate have been each formed into the concave and convex configuration by etching. Therefore, after the gallium nitride-based compound semiconductor is laminated on the substrate in a fabrication step thereof, it is necessary to add an etching step. This not only complicates the fabrication steps, but also increases fabrication cost. Additionally, in this method, concaves and convexes are reduced as the depth of etching is increased so that it is difficult to form the concave and convex configuration over the entire surfaces.

It is therefore an object of the present invention to provide a semiconductor light emitting element which allows an improvement in light extraction efficiency by forming concaves and convexes over the entire side faces of the semiconductor light emitting element without increasing the number of fabrication steps, and a wafer.

Means for Solving the Problems

A semiconductor light emitting element of the present invention is a semiconductor light emitting element formed by laminating a compound semiconductor layer on a single crystal substrate, and dividing the single crystal substrate into pieces, wherein the single crystal substrate has a hexagonal structure, and the side faces of the divided single crystal substrate are formed of planes different from the cleaved planes of the single crystal substrate.

A wafer of the present invention is a wafer which is a single crystal substrate on which a compound semiconductor layer forming a semiconductor light emitting element is laminated, wherein the single crystal substrate has a hexagonal structure, and an OF (Oriented Flat) surface indicative of the crystal direction of the single crystal substrate is formed of a plane different from cleaved planes.

In a preferred embodiment, a plane of the single crystal substrate on which the compound semiconductor layer is laminated is a (0001) plane.

In another preferred embodiment, a plane of the single crystal substrate on which the compound semiconductor layer is laminated is an a-plane, and a c-plane and an m-plane each orthogonal to the a-plane are the cleaved planes of the single crystal substrate. The a-plane indicates a plane with a (11-20) plane orientation, or a (1-210) plane or a (-2110) plane which is equivalent to the (11-20) plane. The c-plane indicates a plane with a (0001) orientation. The m-plane indicates a plane with a (1-100) plane orientation, or a (01-10) plane or a (10-10) plane which is equivalent to the (1-100) plane. More strictly, the sign of a numeral representing a plane orientation is different at a top side plane than at a back side plane. However, it is assumed in the present invention that, e.g., the (11-20) plane indicates both of the (11-20) plane and a (-1-120) plane. The c-plane is in orthogonal relation to all the a-planes and the m-planes. As combinations in each of which the a-plane is orthogonal to the m-plane, there are three combinations in which the a-planes and the m-planes are (11-20) and (1-100), (1-210) and (10-10), and (-2110) and (01-10), respectively. In the present invention, the three combinations in which the a-planes and the m-planes are orthogonal to each other will be mentioned hereinbelow.

EFFECT OF THE INVENTION

In the present invention, it is sufficient that the side faces of the single crystal substrate are formed of planes different from the cleaved planes. Accordingly, it is unnecessary to add a new fabrication step in order to improve light extraction efficiency. Therefore, a semiconductor element with high brightness efficiency can be provided without increasing fabrication cost.

BRIEF DESCRIPTION OF THE DRAWINGS

FIG. 4(A) is a view showing the surface roughness of a side face of a semiconductor light emitting element according to Example 1, and FIG. 4(B) is a view showing the surface roughness of a side face of Comparative Example 1 as a conventional semiconductor light emitting element;

FIG. 6(A) is a drawing-substitute photograph in which a side face of the semiconductor light emitting element according to Example 1 is enlarged, FIG. 6(B) is a drawing-substitute photograph in which another side face of the semiconductor light emitting element according to Example 1 is enlarged, FIG. 6(C) is a drawing-substitute photograph in which a side face of Comparative Example 1 as the conventional semiconductor light emitting element is enlarged, and FIG. 6(D) is a drawing-substitute photograph in which another side face of the conventional semiconductor light emitting element of Comparative Example 1 is enlarged;

FIG. 9 is a perspective view showing the wafer according to Embodiment 2;

FIG. 10(A) is a view showing the surface roughness of a side face of a semiconductor light emitting element according to Example 2, and FIG. 10(B) is a view showing the surface roughness of a side face of Comparative Example 2 as a conventional semiconductor light emitting element; and FIG. 11 is a view showing a conventional wafer according to Comparative Example 2, and a compound semiconductor layer and electrodes each formed on the wafer.

DESCRIPTION OF NUMERALS

Figure 1:
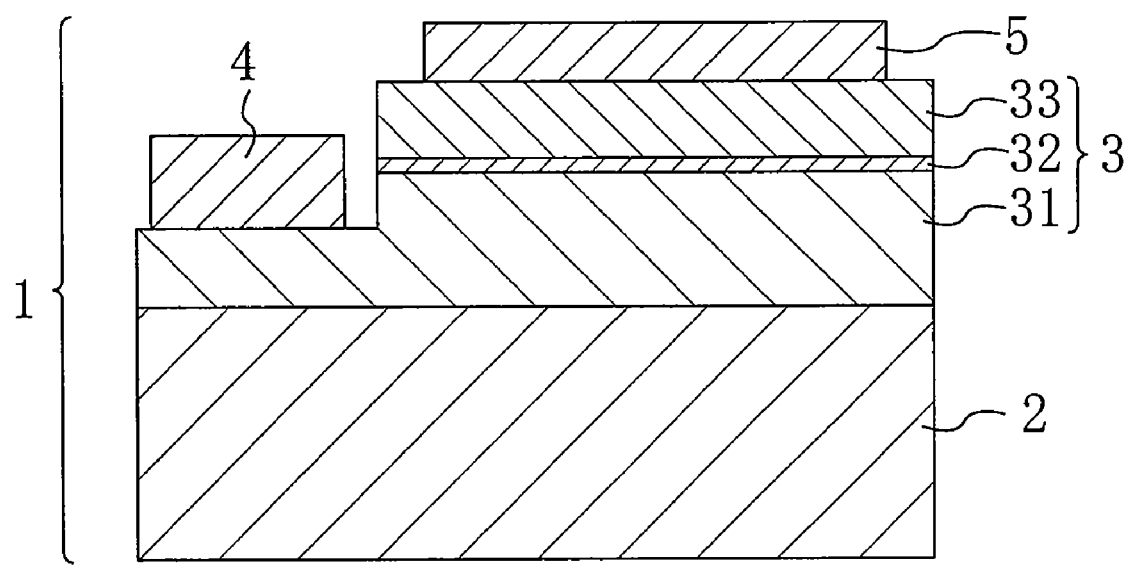
FIG. 1 is a cross-sectional view showing a semiconductor light emitting element according to Embodiment 1.

1, 1' Semiconductor Light Emitting Elements
2, 2' Substrate Pieces
3, 3' Compound Semiconductor Layers
4, 4' n-Electrodes
5, 5' p-Electrodes
10, 10' Wafers
11, 12 OF Surfaces
11', 12' OF Surfaces
20, 20' Lamination Planes
21 to 28 Side Faces
21' to 28' Side Faces
31, 31' n-Type Semiconductor Layers
32, 32' Light Emitting Layers
33, 33' p-Type Semiconductor Layers

BEST MODE FOR CARRYING OUT THE INVENTION

Before a description is given to the best modes, the outline of the embodiments will be described.

A semiconductor light emitting element in an embodiment of the present application is a semiconductor light emitting element formed by laminating a compound semiconductor layer on a single crystal substrate, and dividing the single crystal substrate into pieces, wherein the single crystal substrate has a hexagonal crystalline structure in which a (0001) plane is a lamination plane on which the compound semiconductor is laminated, and a (1-100) plane, a (0-110) plane, a (-1010) plane, a (-1100) plane, a (01-10) plane, and a (10-10) plane are cleaved planes, and all side faces of each of substrate pieces as the divided single crystal substrate are formed of planes different from the cleaved planes of the single crystal substrate. The notation of planes is given herein using Miller indices, and it is assumed that the sign—present in the notation of planes overlies a numeral subsequent to the sign—.

By dividing a crystal at the cleaved planes thereof, the resulting division planes become flat and smooth. By forming the side faces of the single crystal substrate of planes different from the cleaved planes of the crystalline structure in the single crystal substrate, the side faces of the substrate pieces as the divided single crystal substrate do not become flat and smooth faces but become faces with extremely small concaves and convexes. Therefore, when the single crystal substrate is divided in a fabrication step, it is sufficient to form the side faces of the substrate pieces of planes different from the cleaved planes. As a result, it is unnecessary to add a new fabrication step in order to improve light extraction efficiency.

In the semiconductor light emitting element mentioned above, the lamination plane of the substrate piece may also be formed in a generally rectangular shape, and one side face of the substrate piece may also form an angle of not less than 5° and not more than 25° with respect to any of the cleaved planes.

The angle formed between the individual cleaved planes which are the (1-100) plane, the (0-110) plane, the (-1010) plane, the (-1100) plane, the (01-10) plane, and the (10-10) plane of the hexagonal columnar crystalline structure is 60°. Therefore, when the substrate pieces are formed by dividing a lamination plane of the single crystal substrate into generally rectangular shapes, it is possible form each of the side surfaces of the substrate pieces of a plane different from the cleaved planes by performing the division such that each of the resulting division planes forms a predetermined angle with respect to any of the cleaved planes. Additionally, by adjusting the predetermined angle to a value of not less than 5° and not more than 25°, it is possible to ensure 5° or more for each of the side faces of the substrate piece as an angle formed thereby with respect to the cleaved plane. Therefore, by thus regulating the angle, it is possible to prevent the single crystal substrate from cracking first at the cleaved plane when the division is performed while circumventing the cleaved planes, and reliably form concaves and convexes in the side face.

The lamination plane of the substrate piece may also be formed in a generally rectangular shape, and one side face of the substrate piece may form an angle of not less than 10° and not more than 20° with respect to any of the cleaved planes.

By dividing the single crystal substrate such that one side face of the substrate piece forms an angle of not less than 10° and not more than 20° with respect to any of the cleaved planes, it is possible to ensure 10° or more for each of the side faces of the substrate piece as an angle formed thereby with respect to the cleaved plane. Therefore, by thus regulating the angle, it is possible to more reliably prevent the single crystal substrate from being cracked first at the cleaved plane when the division is performed while circumventing the cleaved planes, and form a larger number of concaves and convexes. This allows a further increase in light extraction efficiency.

The single crystal substrate may also be formed of any of a gallium nitride-based compound semiconductor, a zinc oxide-based compound semiconductor, a silicon carbide compound semiconductor, and an aluminum nitride-based compound semiconductor.

When the single crystal substrate is formed of any of a gallium nitride-based compound semiconductor, a zinc oxide-based compound semiconductor, a silicon carbide compound semiconductor, and an aluminum nitride-based compound semiconductor, and divided such that a lamination plane on which the compound semiconductor is laminated is the (0001) plane and formed in a generally rectangular shape, and each of the resulting division planes forms a predetermined angle with respect to any of the cleaved planes, it is possible to form all the side faces of the divided substrate pieces of planes different from the cleaved planes because each of a gallium nitride-based compound semiconductor, a zinc oxide-based compound semiconductor, a silicon carbide compound semiconductor, and an aluminum nitride-based compound semiconductor has a hexagonal crystalline structure in which the (1-100) plane, the (0-110) plane, the (-1010) plane, the (-1100) plane, the (01-10) plane, and the (10-10) plane are cleaved planes.

The compound semiconductor layer laminated on the single crystal substrate may also be formed of any of a gallium nitride-based compound semiconductor, a zinc oxide-based compound semiconductor, and an aluminum nitride-based compound semiconductor.

The compound semiconductor layer can be formed of any of a gallium nitride-based compound semiconductor, a zinc oxide-based compound semiconductor, and an aluminum nitride-based compound semiconductor. In particular, when the single crystal substrate is made of any of a gallium nitride-based compound semiconductor, a zinc oxide-based compound semiconductor, and an aluminum nitride-based compound semiconductor, the compound semiconductor layer can be laminated in the same crystal orientation as that of the crystal substrate. As a result, when the single crystal substrate is divided into pieces, the side faces of the compound semiconductor layer are also formed of planes different from the cleaved planes. This allows an improvement in light extraction efficiency.

A wafer in an embodiment of the present application is a wafer which is a single crystal substrate on which a layer of a compound semiconductor forming a semiconductor light emitting element is laminated, wherein the single crystal substrate has a hexagonal crystalline structure in which a (0001) plane is a lamination plane on which the compound semiconductor is laminated, and a (1-100) plane, a (0-110) plane, a (-1010) plane, a (-1100) plane, a (01-10) plane, and a (10-10) plane are cleaved planes, and an OF surface indicative of a crystal direction of the single crystal substrate is formed of a plane different from the cleaved planes.

By forming the OF surface serving as a reference when the wafer is divided or an electrode pattern is formed of a plane different from the cleaved planes of the single crystal substrate, it is possible to form the side faces of the divided single crystal substrate (substrate pieces) of planes different from the cleaved planes when the compound semiconductor is laminated on the wafer, and patterned on the wafer as the single crystal substrate such that the side faces of the rectangular light emitting element are parallel with or perpendicular to the OF surface, and the wafer is divided therealong. By forming the side faces of the substrate pieces of planes different from the cleaved planes, the side faces do not become flat and smooth faces, but faces with extremely small concaves and convexes. Therefore, it is sufficient to form the side faces of the substrate pieces of planes different from the cleaved planes when the single crystal substrate is divided in a fabrication step. As a result, it is unnecessary to add a new fabrication step in order to improve light extraction efficiency.

In the wafer mentioned above, the OF surface may also form an angle of not less than 5° and not more than 25° with respect to any of the cleaved planes.

When it is assumed that the single crystal substrate has a hexagonal crystalline structure in which the (0001) plane is a lamination plane on which the compound semiconductor is laminated, and the (1-100) plane, the (0-110) plane, the (-1010) plane, the (-1100) plane, the (01-10) plane, and the (10-10) plane are the cleaved planes, the angle formed by one of the (1-100) plane, the (0-110) plane, the (-1010) plane, the (-1100) plane, the (01-10) plane, and the (10-10) plane with respect to another is 60°. Therefore, by forming the OF surface serving as a reference when the wafer is divided or an electrode pattern is formed of a plane forming a predetermined angle with respect to any of the cleaved planes, it is possible to form each of the side faces of the divided single crystal substrate (substrate pieces) of a plane different from the cleaved planes when the compound semiconductor is laminated on the wafer, and patterned on the wafer as the single crystal substrate such that the side faces of the rectangular light emitting element are parallel with or perpendicular to the OF surface, and the wafer is divided therealong. Additionally, by adjusting the predetermined angle to a value of not less than 5° and not more than 25°, it is possible to ensure 5° or more for each of the side faces of the substrate pieces as an angle formed thereby with respect to the cleaved plane. As a result, it is possible to prevent the wafer from being cracked first at the cleaved plane when the division is performed while circumventing the cleaved planes, and reliably form concaves and convexes in the side face.

The OF surface may also form an angle of not less than 10° and not more than 20° with respect to any of the cleaved planes.

By forming the OF surface serving as a reference when the wafer is divided or an electrode pattern is formed of a plane forming an angle of not less than 10° and not more than 20° with respect to any of the cleaved planes, it is possible to ensure 10° or more for each of the side faces of the divided single crystal substrate (substrate pieces) as an angle formed thereby with respect to the cleaved plane when the compound semiconductor is laminated on the wafer, and patterned on the wafer as the single crystal substrate such that the side faces of the rectangular light emitting element are parallel with or perpendicular to the OF surface, and the wafer is divided therealong. As a result, it is possible to more reliably prevent the wafer from being cracked first at the cleaved plane when the division is performed while circumventing the cleaved planes, and form a larger number of concaves and convexes. This allows a further increase in light extraction efficiency.

The single crystal substrate may also be formed of any of a gallium nitride-based compound semiconductor, a zinc oxide-based compound semiconductor, a silicon carbide compound semiconductor, and an aluminum nitride-based compound semiconductor.

When the single crystal substrate is formed of any of a gallium nitride-based compound semiconductor, a zinc oxide-based compound semiconductor, a silicon carbide compound semiconductor, and an aluminum nitride-based compound semiconductor, and divided such that a lamination plane on which the compound semiconductor is laminated is the (0001) plane and formed in a generally rectangular shape, and each of the resulting division planes forms a predetermined angle with respect to any of the cleaved planes, it is possible to form all the side faces of the divided substrate pieces of planes different from the cleaved planes because each of a gallium nitride-based compound semiconductor, a zinc oxide-based compound semiconductor, a silicon carbide compound semiconductor, and an aluminum nitride-based compound semiconductor has a hexagonal crystalline structure in which the (1-100) plane, the (0-110) plane, the (-1010) plane, the (-1100) plane, the (01-10) plane, and the (10-10) plane are cleaved planes.

A semiconductor light emitting element in another embodiment of the present application is a semiconductor light emitting element formed by laminating a compound semiconductor layer on a single crystal substrate, and dividing the single crystal substrate into pieces, wherein the single crystal substrate has a hexagonal crystalline structure in which an a-plane is a lamination plane on which the compound semiconductor is laminated, and a c-plane and an m-plane each orthogonal to the a-plane are cleaved planes, and all side faces of each of substrate pieces as the divided single crystal substrate are formed of planes different from the cleaved planes of the single crystal substrate.

By dividing a crystal at the cleaved planes thereof, the resulting division planes become flat and smooth. By forming the side faces of the single crystal substrate of planes different from the cleaved planes of the crystalline structure in the single crystal substrate, the side faces of the substrate pieces as the divided single crystal substrate do not become flat and smooth faces but become faces with extremely small concaves and convexes. Therefore, when the single crystal substrate is divided in a fabrication step, it is sufficient to form the side faces of the substrate pieces of planes different from the cleaved planes. As a result, it is unnecessary to add a new fabrication step in order to improve light extraction efficiency.

In the semiconductor light emitting element mentioned above, the lamination plane of the substrate piece may also be formed in a generally rectangular shape, and one side face of the substrate piece may also form an angle of not less than 5° and not more than 85° with respect to either of the c-plane and the m-plane which are the cleaved planes.

In the substrate having the hexagonal crystalline structure in which the a-plane forms a surface thereof, the c-plane and the m-plane serving as the cleaved planes are each perpendicular to the surface of the substrate, and the angle formed therebetween is 90°. Accordingly, when the substrate pieces are formed by dividing the lamination plane of the single crystal substrate into generally rectangular shapes, the division is performed such that each of the resulting division planes forms a predetermined angle with respect to either of the c-plane and the m-plane to allow each of the side faces of the substrate pieces to be formed of a plane different from the cleaved planes. Additionally, by adjusting the predetermined angle to a value of not less than 5° and not more than 85°, it is possible to ensure 5° or more for each of the side faces of the substrate pieces as an angle formed thereby with respect to the cleaved plane. Therefore, it is possible to prevent the substrate from cracking first at the cleaved plane when the division is performed while circumventing the cleaved planes, and reliably form concaves and convexes in the side face.

The lamination plane of the substrate piece may also be formed in a generally rectangular shape, and one side face of the substrate piece forms an angle of not less than 30° and not more than 60° with respect to either of the c-plane and the m -plane. The arrangement makes it possible to ensure 15° or more for each of the side faces of the substrate pieces as an angle formed thereby with respect to the cleaved plane. Therefore, it is possible to more reliably prevent the single crystal substrate from being cracked first at the cleaved plane when the division is performed while circumventing the cleaved planes, and form a larger number of concaves and convexes. This allows a further increase in light extraction efficiency.

The single crystal substrate may also be formed of any of a gallium nitride-based compound semiconductor, a zinc oxide-based compound semiconductor, a silicon carbide compound semiconductor, and an aluminum nitride-based compound semiconductor.

When the single crystal substrate is formed of any of a gallium nitride-based compound semiconductor, a zinc oxide-based compound semiconductor, a silicon carbide compound semiconductor, and an aluminum nitride-based compound semiconductor, and divided such that a lamination plane on which the compound semiconductor is laminated is the a-plane and formed in a generally rectangular shape, and each of the resulting division planes forms a predetermined angle with respect to either of the c-plane and the m-plane which are the cleaved planes, it is possible to form all the side faces of the divided substrate pieces of planes different from the cleaved planes because each of a gallium nitride-based compound semiconductor, a zinc oxide-based compound semiconductor, a silicon carbide compound semiconductor, and an aluminum nitride-based compound semiconductor has a hexagonal crystalline structure in which the c-plane and the m-plane are cleaved planes.

The compound semiconductor layer laminated on the single crystal substrate may also be formed of any of a gallium nitride-based compound semiconductor, a zinc oxide-based compound semiconductor, and an aluminum nitride-based compound semiconductor.

The compound semiconductor layer can be formed of any of a gallium nitride-based compound semiconductor, a zinc oxide-based compound semiconductor, and an aluminum nitride-based compound semiconductor. In particular, when the single crystal substrate is made of any of a gallium nitride-based compound semiconductor, a zinc oxide-based compound semiconductor, and an aluminum nitride-based compound semiconductor, the compound semiconductor layer can be laminated in the same crystal orientation as that of the crystal substrate. As a result, when the single crystal substrate is divided into pieces, the side faces of the compound semiconductor layer are also formed of planes different from the cleaved planes. This allows an improvement in light extraction efficiency.

A wafer in another embodiment of the present application is a wafer which is a single crystal substrate on which a compound semiconductor layer forming a semiconductor light emitting element is laminated, wherein the single crystal substrate has a hexagonal crystalline structure in which an a-plane is a lamination plane on which the compound semiconductor is laminated, and a c-plane and an m-plane each orthogonal to the a-plane are cleaved planes, and an OF surface indicative of a crystal direction of the single crystal substrate is formed of a plane different from the cleaved planes.

By forming the OF surface serving as a reference when the wafer is divided or an electrode pattern is formed of a plane different from the c-plane and the m-plane which are the cleaved planes of the single crystal substrate, it is possible to form the side faces of the divided single crystal substrate (substrate pieces) of planes different from the cleaved planes when the compound semiconductor is laminated on the wafer, and patterned on the wafer as the single crystal substrate such that the side faces of the rectangular light emitting element are parallel with or perpendicular to the OF surface, and the wafer is divided therealong. By forming the side faces of the substrate pieces of planes different from the cleaved planes, the side faces do not become flat and smooth faces, but faces with extremely small concaves and convexes. Therefore, it is sufficient to form the side faces of the substrate piece of planes different from the cleaved planes when the single crystal substrate is divided in a fabrication step. As a result, it is unnecessary to add a new fabrication step in order to improve light extraction efficiency.

In the wafer mentioned above, the OF surface may also form an angle of not less than 5° and not more than 85° with respect to either of the cleaved planes.

In the substrate having the hexagonal crystalline structure in which the a-plane forms a surface thereof, the c-plane and the m-plane serving which are the cleaved planes are each perpendicular to the surface of the substrate, and the angle formed therebetween is 90°. Accordingly, by forming the OF surface serving as a reference when the wafer is divided or an electrode pattern is formed of a plane forming a predetermined angle with respect to either of the c-plane and the m-plane which are the cleaved planes, it is possible to form each of the side faces of the divided single crystal substrate (substrate pieces) of a plane different from the cleaved planes when the compound semiconductor is laminated on the wafer, and patterned on the wafer as the single crystal substrate such that the side faces of the rectangular light emitting element are parallel with or perpendicular to the OF surface, and the wafer is divided therealong. Additionally, by adjusting the predetermined angle to a value of not less than 5° and not more than 85°, it is possible to ensure 5° or more for each of the side faces of the substrate pieces as an angle formed thereby with respect to the cleaved plane. Therefore, it is possible to prevent the wafer from cracking first at the cleaved plane when the division is performed while circumventing the cleaved planes, and reliably form concaves and convexes in the side face.

The OF surface may also form an angle of not less than 30° and not more than 60° with respect to either of the c-plane and the m-plane as the cleaved planes.

By forming the OF surface serving as a reference when the wafer is divided or an electrode pattern is formed of a plane forming an angle of not less than 30° and not more than 60° with respect to either of the c-plane and the m-plane which are the cleaved planes, it is possible to ensure 30° or more for each of the side faces of the divided single crystal substrate (substrate pieces) as an angle formed thereby with respect to the cleaved plane when the compound semiconductor is laminated on the wafer, and patterned on the wafer as the single crystal substrate such that the side faces of the rectangular light emitting element are parallel with or perpendicular to the OF surface, and the wafer is divided therealong. As a result, it is possible to more reliably prevent the wafer from being cracked first at the cleaved plane when the division is performed while circumventing the cleaved planes, and form a larger number of concaves and convexes. This allows a further increase in light extraction efficiency.

The single crystal substrate may also be formed of any of a gallium nitride-based compound semiconductor, a zinc oxide-based compound semiconductor, a silicon carbide compound semiconductor, and an aluminum nitride-based compound semiconductor.

When the single crystal substrate is formed of any of a gallium nitride-based compound semiconductor, a zinc oxide-based compound semiconductor, a silicon carbide compound semiconductor, and an aluminum nitride-based compound semiconductor, and divided such that a lamination plane on which the compound semiconductor is laminated is the a-plane and formed in a generally rectangular shape, and each of the resulting division planes forms a predetermined angle with respect to either of the c-plane and the m-plane which are the cleaved planes, it is possible to form all the side faces of the divided substrate pieces of planes different from the cleaved planes because each of a gallium nitride-based compound semiconductor, a zinc oxide-based compound semiconductor, a silicon carbide compound semiconductor, and an aluminum nitride-based compound semiconductor has a hexagonal crystalline structure in which the c-plane and the m-plane are cleaved planes.

Referring to the drawings, the embodiment of the present invention will be described hereinbelow in detail. In the drawings shown below, components having substantially the same functions will be denoted by the same reference numerals for the sake of simple explanation.

Embodiment 1

Figure 2:
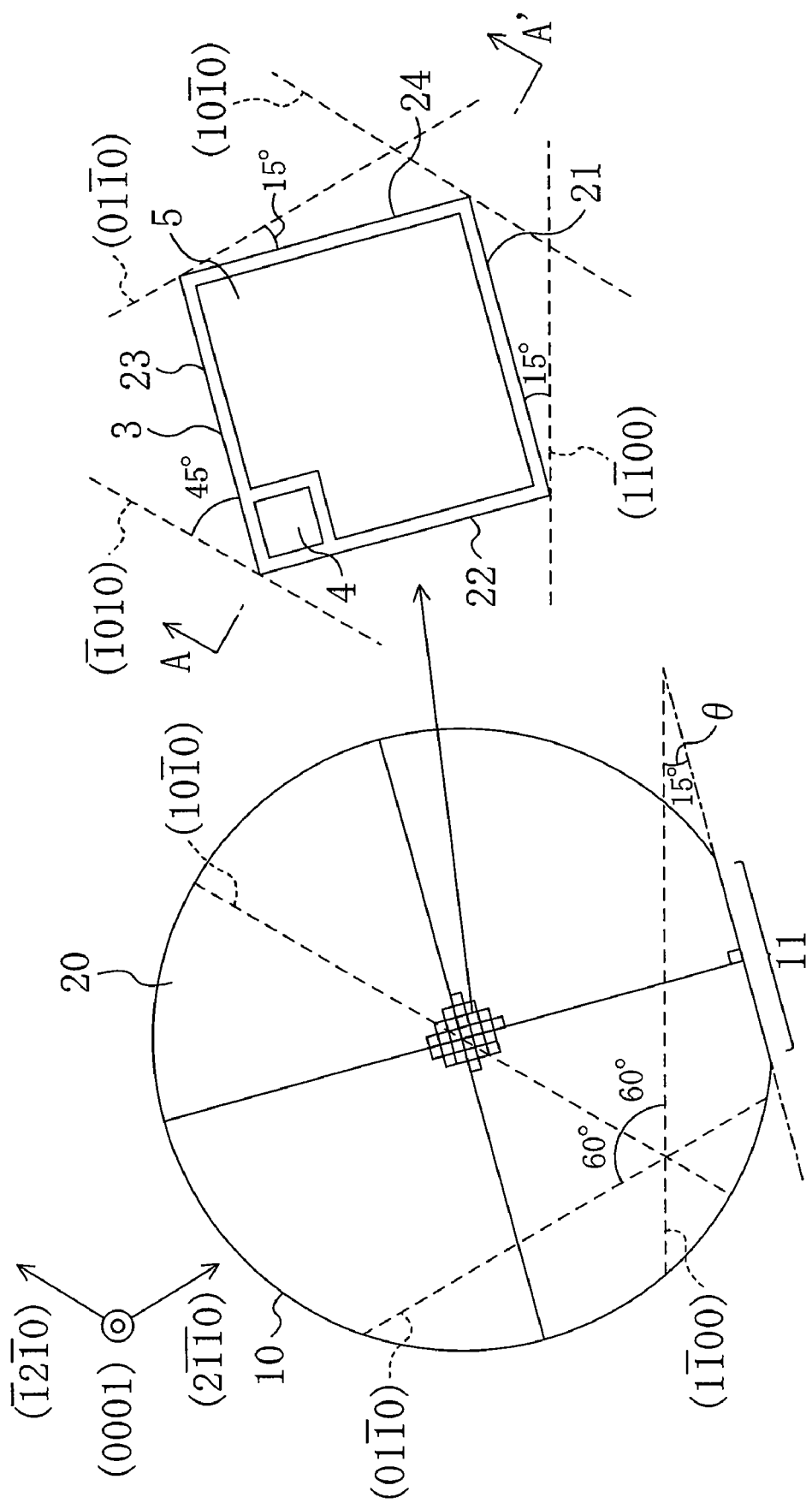
FIG. 2 is a view showing a wafer according to Embodiment 1, and a compound semiconductor layer and electrodes each formed on the wafer.

A semiconductor light emitting element according to Embodiment 1 will be described with reference to FIGS. 1 and 2. FIG. 1 is a cross-sectional view showing a semiconductor light emitting element 1 according to the present embodiment. FIG. 2 is a view showing a wafer according to the present embodiment, and a compound semiconductor layer and electrodes each formed on the wafer.

As shown in FIG. 1, the semiconductor light emitting element 1 includes a substrate piece 2, a compound semiconductor layer 3, an n-electrode 4, and a p-electrode 5, and is formed by dividing a wafer-state single crystal substrate on which the compound semiconductor layer is laminated. For the substrate piece 2 which is a single crystal substrate, any substrate piece having a light transmitting property can be used. In the present embodiment, the substrate piece 2 can be formed of any of a gallium nitride-based compound semiconductor, a silicon carbide compound semiconductor, a zinc oxide-based compound semiconductor, and an aluminum nitride-based compound semiconductor.

The semiconductor light emitting element 1 is formed by dividing a lamination plane 20 of a wafer 10 shown in FIG. 2 into generally rectangular shapes. It is to be noted that a cross-sectional view along the line A-A' of FIG. 2 is FIG. 1. When the substrate piece 2 is divided from the wafer 10, the division is performed such that the side faces 21 to 24 of the substrate piece 2 are formed of planes different from cleaved planes, so that the surfaces thereof are formed with extremely small concaves and convexes which are larger in number than when the wafer 10 is divided at the cleaved planes.

The compound semiconductor layer 3 is laminated on the (0001) plane of the substrate piece 2 having a hexagonal crystalline structure. To improve the crystal quality of the compound semiconductor layer 3, it is also possible to use a plane shifted by 0.2° to 5° from the (0001) plane of the substrate piece 2 as the plane on which the compound semiconductor layer 3 is laminated.

The compound semiconductor layer 3 can be formed of a gallium nitride-based compound semiconductor layer when the substrate piece 2 is made of, e.g., a gallium nitride-based compound semiconductor, a silicon carbide compound semiconductor, a zinc oxide-based compound semiconductor, or an aluminum nitride-based compound semiconductor. When the substrate piece 2 is made of, e.g., a zinc oxide-based compound semiconductor, the compound semiconductor layer 3 can be formed of a zinc oxide-based compound semiconductor layer. In particular, when the substrate piece 2 is made of a gallium nitride-based compound semiconductor, the compound semiconductor layer 3 is preferably formed of a gallium nitride-based compound semiconductor. When the substrate piece 2 is made of a zinc oxide-based compound semiconductor, the compound semiconductor layer 3 is preferably formed of a zinc oxide-based compound semiconductor layer.

Although the compound semiconductor layer 3 can be grown using an organic metal vapor phase growth method, it is also possible to use a molecular beam epitaxy method, an organic metal molecular beam epitaxy method, or the like.

When the compound semiconductor layer 3 made of such a material is grown on the single crystal substrate (wafer 10), the compound semiconductor layer 3 is laminated in a state where the direction of a cleaved plane of the single crystal substrate is coincident with the direction of a cleaved plane of the compound semiconductor layer 3. Accordingly, the side faces of the compound semiconductor layer 3 can also be formed into faces with extremely small concaves and convexes.

The compound semiconductor layer 3 includes an n-type semiconductor layer 31, a light emitting layer 32, and a p-type semiconductor layer 33. It is also possible to provide a buffer layer between the n-type semiconductor layer 31 and the substrate piece 2. The compound semiconductor layer 3 is formed by successively growing the n-type semiconductor layer 31, the light emitting layer 32, and the p-type semiconductor layer 33 on the single crystal substrate using a crystal growth apparatus.

The n-electrode 4 is formed on the exposed n-type semiconductor layer 31 obtained by partly removing each of the p-type semiconductor layer 33, the light emitting layer 32, and the n-type semiconductor layer 31 by dry etching, and thereby exposing the region of the single crystal substrate formed with the compound semiconductor layer 3 where the n-electrode 4 is formed. When the single crystal substrate has an n-type conductivity, the n-electrode 4 may also be formed on the single crystal substrate which has been exposed by partly removing each of the p-type semiconductor layer 33, the light emitting layer 32, the n-type semiconductor layer 31, and the single crystal substrate by dry etching. The n-electrode 4 may also be formed on the plane of the single crystal substrate opposite to the plane thereof on which the compound semiconductor layer 3 is laminated.

The p-electrode 5 is an electrode for bonding, and formed of Au. The p-electrode 5 can be formed into a multilayer structure. For example, a contact layer can be provided to provide an ohmic contact with the p-type semiconductor layer 33. The contact layer can be formed of In, Zn, Pt, Pd, Ni, an alloy containing at least one of these metals, or a conductive film. When the contact layer is formed of a conductive film, it can be formed of ITO or ZnO.

Additionally, a reflection layer for reflecting light passing through the p-type semiconductor layer 33 in the direction of the substrate piece 2 can be provided next to the contact layer. The reflection layer can be formed of Ag, Al, Rh, or an alloy containing at least one of these metals, and is preferably formed of Ag or an Ag alloy having a high reflectance.

Figure 3:
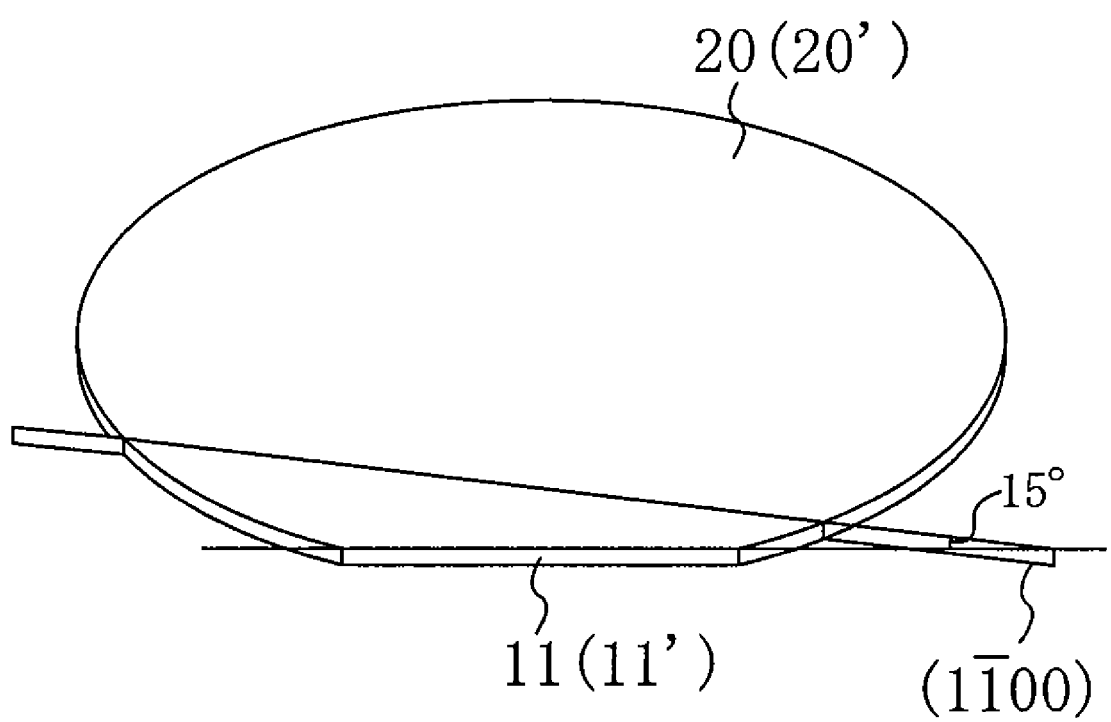
FIG. 3 is a perspective view showing the wafer according to Embodiment 1.

A detailed description will be given herein to the semiconductor light emitting element 1 formed by dividing the single crystal substrate on which the compound semiconductor layer is laminated with reference to FIG. 2, and further to FIG. 3. FIG. 3 is a perspective view showing the wafer according to the present embodiment.

As shown in FIGS. 2 and 3, the wafer 10 has the compound semiconductor layer 3 laminated on the lamination plane 20, and is formed with the n-electrode 4 and the p-electrode 5. After being scribed, the wafer 10 is divided along scribe lines into pieces, each of which serves as the semiconductor light emitting element 1. The wafer 10 has a generally disk shape formed with an OF surface 11 serving as a reference when the wafer 10 is divided or an electrode pattern is formed, and is formed of a gallium nitride-based compound semiconductor, a silicon carbide compound semiconductor, a zinc oxide-based compound semiconductor, or an aluminum nitride-based compound semiconductor having a hexagonal crystalline structure. In each of these semiconductors having the hexagonal crystalline structure, the angle formed between any two of the (1-100) plane, the (0-110) plane, the (-1010) plane, the (-1100) plane, the (01-10) plane, and the (10-10) plane, which are the cleaved planes, is 60°.

The n-electrode 4 and the p-electrode 5 are formed on the wafer 10 such that the side faces of the rectangular semiconductor light emitting element are parallel with or perpendicular to the OF surface 11, and the arrangement thereof is perpendicular to and parallel with the OF surface 11. When the wafer 10 is divided, the division is performed along the electrode pattern in a direction parallel with or perpendicular to the OF surface 11. In the present embodiment, the OF surface 11 is provided in a state where it forms an angle θ of 15° with respect to the (1-100) plane which is the cleaved plane. By dividing the wafer 10 along the electrode pattern, the side face 21 of the substrate piece 2 formed in a rectangular shape is in a state where it forms an angle of 15° with respect to the (1-100) plane which is the cleaved plane.

That is, by setting the angle formed between the side face 21 of the substrate piece 2 and the (1-100) plane to 15°, the side face 21 of the substrate piece 2 also forms an angle of 45° with respect to the (10-10) plane, and forms an angle of 75° with respect to the (01-10) plane. On the other hand, the side face 22 adjacent to the side face 21 forms an angle of 75° with respect to the (1-100) plane, forms an angle of 45° with respect to the (10-10) plane, and forms an angle of 15° with respect to the (01-10) plane.

The side face 23 opposite to the side face 21 also forms an angle of 15° with respect to the (1-100) plane, forms an angle of 45° with respect to the (10-10) plane, and forms an angle of 75° with respect to the (01-10) plane, similarly to the side face 21. Further, the side face 24 parallel with the side face 22 also forms an angle of 75° with respect to the (1-100) plane, forms an angle of 45° with respect to the (10-10) plane, and forms an angle of 15° with respect to the (01-10) plane, similarly to the side face 22.

By thus dividing the wafer 10 having the single crystal substrate and the compound semiconductor layer laminated thereon into pieces, the side faces 21 to 24 of the substrate piece 2 can be formed of planes different from the cleaved planes.

The division can be easily performed by forming trenches each partitioning the wafer 10 into pieces and having a depth of several tens of micrometers using a laser scribe apparatus, and splitting the wafer 10 at the trenches.

The trenches formed by the laser scribing may be formed either in the plane of the wafer 10 on which the compound semiconductor layer 3 is laminated or on the plane thereof opposite to the plane on which the compound semiconductor layer 3 is laminated. However, the trenches are preferably formed in the plane opposite to the plane on which the compound semiconductor layer 3 is laminated because the same concaves and convexes as formed in the substrate piece 2 are formed also in the division planes of the compound semiconductor layer 3 after it is divided into pieces.

By thus forming the side faces 21 to 24 of the substrate piece 2 of planes different from the cleaved planes, it is possible to form the side planes 21 to 24 into faces formed with extremely small concaves and convexes, not into flat and smooth faces, and improve light extraction efficiency.

Thus, it is sufficient to form the side faces of the substrate piece 2 of planes different from the cleaved planes when the single crystal substrate is divided in a fabrication step. As a result, it is unnecessary to add a new fabrication step in order to improve light extraction efficiency by forming concaves and convexes in the side faces of the semiconductor light emitting element 1. Therefore, complication during fabrication and an increase in fabrication cost can be suppressed.

The present embodiment has described the case where the division is performed such that each of the side faces of the substrate piece 2 forms an angle of 15° with respect to the cleaved plane. This is because, when the side surface of the substrate piece 2 used as a reference is caused to form an angle of 15° with respect to the cleaved surface, it is possible to form an angle of not less than 15° with respective each of the cleaved planes, and the angle formed between the different cleaved planes is constantly 60°. Therefore, it is sufficient for the angle formed by the side face of the substrate piece 2 used as the reference with reference to the cleaved plane to be more than 0° and less than 30°.

However, when the angle is close to 0° or 30°, a crack may occur first at the cleaved plane where cleavage is easy. Therefore, by setting the angle to a value of not less than 5° and not more than 25°, each of the side faces of the substrate piece 2 is allowed to form an angle of not less than 5° with respect to the cleaved plane. As a result, it is possible to prevent a crack occurring first at the cleaved plane when the division is performed while circumventing the cleaved planes.

By further causing each of the side faces of the substrate piece 2 to form an angle of not less than 10° and not more than 20° with respect to the cleaved plane, the side face is allowed to form an angle of not less than 10° with respect to the cleaved plane. As a result, it is possible to more reliably prevent a crack occurring first at the cleaved plane, form a larger number of concaves and convexes, and further increase light extraction efficiency.

Embodiment 2

A semiconductor light emitting element according to Embodiment 2 will be described with reference to FIGS. 7 and 8. Although the structure and configuration of a semiconductor light emitting element 1' according to the present embodiment are the same in outer appearance as those of the semiconductor light emitting element 1 according to Embodiment 1, the plane orientation of the outer surface is different from that in Embodiment 1 so that reference numerals are changed from those of Embodiment 1.

Figure 7:
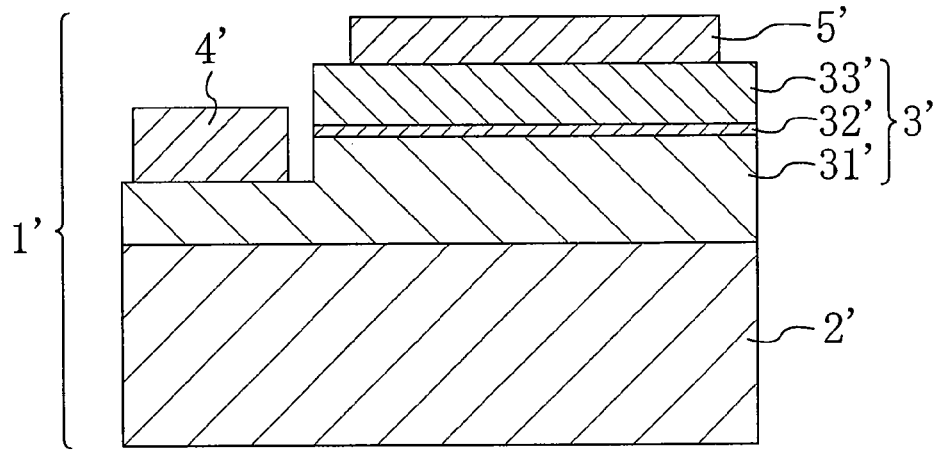
FIG. 7 a cross-sectional view showing a semiconductor light emitting element according to Embodiment 2.

As shown in FIG. 7, the semiconductor light emitting element 1' includes a substrate piece 2', a compound semiconductor layer 3', an n-electrode 4', and a p-electrode 5', and is formed by dividing a wafer-state single crystal substrate on which the compound semiconductor layer is laminated. For the substrate piece 2' which is a single crystal substrate, any substrate having a light transmitting property can be used. In the present embodiment, the substrate piece 2' can be formed of any of a gallium nitride-based compound semiconductor, a silicon carbide compound semiconductor, a zinc oxide-based compound semiconductor, and an aluminum nitride-based compound semiconductor.

Figure 8:
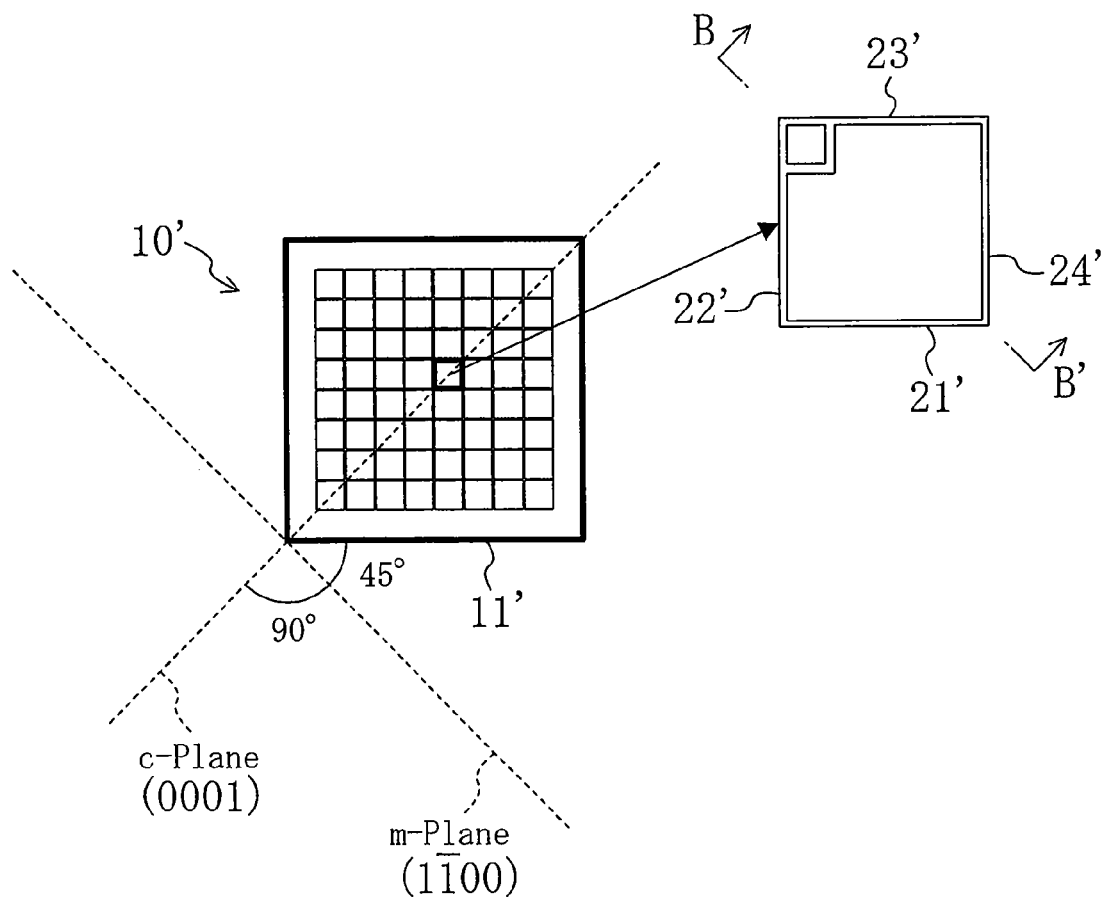
FIG. 8 is a view showing a wafer according to Embodiment 2, and a compound semiconductor layer and electrodes each formed on the wafer.

As shown in FIG. 8, the semiconductor light emitting element 1' is formed by dividing a lamination plane 20' of a wafer. It is to be noted that FIG. 7 is a cross-sectional view along the line B-B' of FIG. 8. When the substrate piece 2' is divided from the wafer, the division is performed such that the side faces 21' to 24' of the substrate 2' are formed of planes different from cleaved planes, so that the surfaces thereof are formed with extremely small concaves and convexes which are larger in number than when the wafer is divided at the cleaved planes.

The compound semiconductor layer 3' is laminated on the a-plane of the substrate piece 2' having a hexagonal crystalline structure. To improve the crystal quality of the compound semiconductor layer 3', it is also possible to use a plane shifted by 0.2° to 5° from the a-plane of the substrate piece 2' as the plane on which the compound semiconductor layer 3' is laminated.

The compound semiconductor layer 3' can be formed of a gallium nitride-based compound semiconductor layer when the substrate piece 2' is made of, e.g., a gallium nitride-based compound semiconductor, a silicon carbide compound semiconductor, a zinc oxide-based compound semiconductor, or an aluminum nitride-based compound semiconductor. When the substrate piece 2' is made of, e.g., a zinc oxide-based compound semiconductor, the compound semiconductor layer 3' can be formed of a zinc oxide-based compound semiconductor layer. In particular, when the substrate piece 2' is made of a gallium nitride-based compound semiconductor, the compound semiconductor layer 3' is preferably formed of a gallium nitride-based compound semiconductor. When the substrate piece 2' is made of a zinc oxide-based compound semiconductor, the compound semiconductor layer 3' is preferably formed of a zinc oxide-based compound semiconductor layer.

When the compound semiconductor layer 3' made of such a material is grown on the single crystal substrate 2', the compound semiconductor layer 3' is laminated in a state where the direction of a cleaved plane of the single crystal substrate 2' is coincident with the direction of a cleaved plane of the compound semiconductor layer 3'. Accordingly, the side faces of the compound semiconductor layer 3' can also be formed into faces with extremely small concaves and convexes.

The compound semiconductor layer 3' includes an n-type semiconductor layer 31', a light emitting layer 32', and a p-type semiconductor layer 33'. It is also possible to provide a buffer layer between the n-type semiconductor layer 31' and the substrate piece 2'. A formation method of the compound semiconductor layer 3' is the same as in Embodiment 1.

As for the configurations, structures, formation places, and formation method of the n-electrode 4' and the p-electrode 5', they are the same as in Embodiment 1.

Additionally, a reflection layer for reflecting light passing through the p-type semiconductor layer 33' in the direction of the substrate piece 2' can be provided next to the contact layer. The reflection layer can be formed of Ag, Al, Rh, or an alloy containing at least one of these metals, and is preferably formed of Ag or an Ag alloy having a high reflectance.

A detailed description will be given herein to the semiconductor light emitting element 1' formed by dividing the single crystal substrate on which the compound semiconductor layer is laminated with reference to FIG. 8, and further to FIG. 9.

As shown in FIGS. 8 and 9, the wafer 10' has the compound semiconductor layer 3' laminated on the single crystal substrate, and is formed with the n-electrode 4' and the p-electrode 5'. After being scribed, the wafer 10' is divided along scribe lines into pieces, each of which serves as the semiconductor light emitting element 1'. The wafer 10' is in the shape of a rectangular plate formed with an OF surface 11' serving as a reference when the wafer is divided or an electrode pattern is formed, and is formed of a gallium nitride-based compound semiconductor, a silicon carbide compound semiconductor, a zinc oxide-based compound semiconductor, or an aluminum nitride-based compound semiconductor having a hexagonal crystalline structure. In each of these semiconductors having the hexagonal crystalline structure, the angle formed between a c-plane and a m-plane which are the cleaved planes is 90°

The n-electrode 4' and the p-electrode 5' are formed on the wafer 10' such that the side faces of the rectangular light emitting element are parallel with or perpendicular to the OF surface 11', and the arrangement thereof is perpendicular to and parallel with the OF surface 11'. When the wafer 10' is divided, the division is performed along the electrode pattern in a direction parallel with or perpendicular to the OF surface 11'. In the present embodiment, the OF surface 11' is provided in a state where it forms an angle of 45° with respect to the m-plane which is the cleaved plane. By dividing the wafer 10' along the electrode pattern, the side face 21' of the substrate piece 2' formed in a rectangular shape is in a state where it forms an angle of 45° with respect to the m-plane which is the cleaved plane.

That is, by setting the angle formed between the side face 21' of the substrate piece 2' and the m-plane to 45°, the side face 21' of the substrate piece 2' forms an angle of 45° with respect to the c-plane. On the other hand, the side face 22' adjacent to the side face 21' forms an angle of 45° with respect to the m-plane, and also forms an angle of 45° with respect to the c-plane.

The side face 23' opposite to the side face 21' also forms an angle of 45° with respect to the m-plane, and also forms an angle of 45° with respect to the c-plane, similarly to the side face 21'. Further, the side face 24' parallel with the side face 22' also forms an angle of 45° with respect to the m-plane, and forms an angle of 45° with respect to the c-plane, similarly to the side face 22'.

By thus dividing the wafer 10' having the single crystal substrate and the compound semiconductor layer laminated thereon into pieces, the side faces 21' to 24' of the substrate piece 2' can be formed of planes different from the cleaved planes.

The division can be easily performed by forming trenches each partitioning the wafer 10' into pieces and having a depth of several tens of micrometers using a laser scribe apparatus, and splitting the wafer 10' along the trenches.

The trenches formed by the laser scribe apparatus may be formed either in the plane of the wafer 10' on which the compound semiconductor layer 3' is laminated or on the plane thereof opposite to the plane on which the compound semiconductor layer 3' is laminated.

By thus forming the side faces 21' to 24' of the substrate piece 2' of planes different from the cleaved planes, it is possible to form the side planes 21' to 24' into faces formed with extremely small concaves and convexes, not into flat and smooth faces, and improve light extraction efficiency.

Thus, it is sufficient to form the side faces of the substrate piece 2' of planes different from the cleaved planes when the single crystal substrate is divided in a fabrication step. As a result, it is unnecessary to add a new fabrication step in order to improve light extraction efficiency by forming concaves and convexes in the side faces of the semiconductor light emitting element 1'. Therefore, complication during fabrication and an increase in fabrication cost can be suppressed.

The present embodiment has described the case where the division is performed such that each of the side faces of the substrate piece 2' forms an angle of 45° with respect to the cleaved plane. This is because, when the side surface of the substrate piece 2' used as a reference is caused to form an angle of 45° with respect to the cleaved surface, it is possible to form an angle of 45° with respective each of the cleaved planes, and the angle formed between the different cleaved planes is constantly 90°. Therefore, it is sufficient for the angle formed by the side face of the substrate piece 2' used as the reference with reference to the cleaved plane to be more than 0° and less than 90°.

However, when the angle is close to 0° or 90°, a crack may occur first at the cleaved plane where cleavage is easy. Therefore, by setting the angle thereof to a value of not less than 5° and not more than 85°, each of the side faces of the substrate piece 2' is allowed to form an angle of not less than 5° with respect to the cleaved plane. As a result, it is possible to prevent a crack occurring first at the cleaved plane when the division is performed while circumventing the cleaved planes.

By further causing each of the side faces of the substrate piece 2' to form an angle of not less than 30° and not more than 60° with respect to the cleaved plane, the side face is allowed to form an angle of not less than 30° with respect to the cleaved plane. As a result, it is possible to more reliably prevent a crack occurring first at the cleaved plane, form a larger number of concaves and convexes, and further increase light extraction efficiency.

EXAMPLES

Example 1

Figure 5:
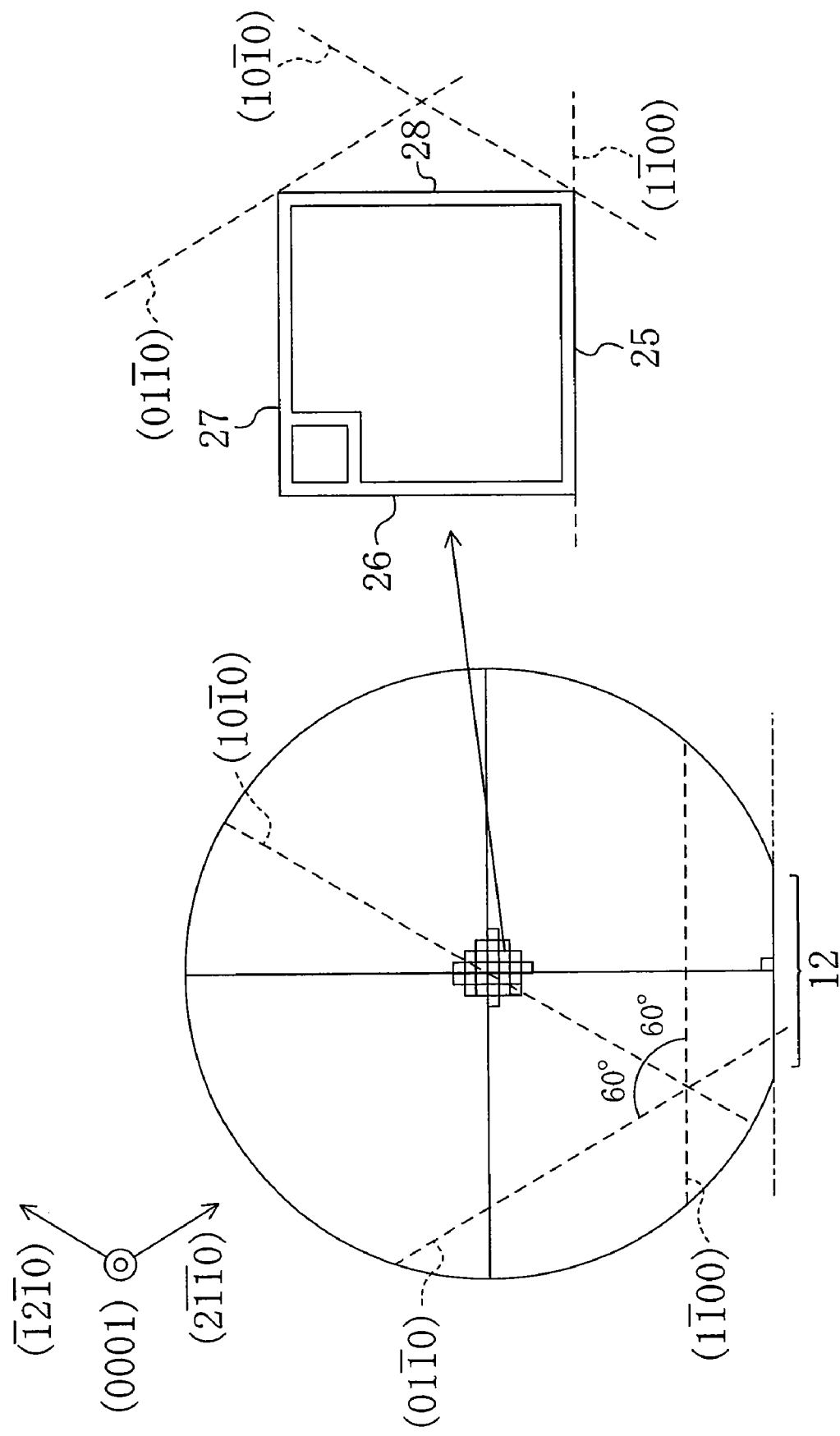
FIG. 5 is a view showing a conventional wafer according to Comparative Example 1, and a compound semiconductor layer and electrodes each formed on the wafer.

The semiconductor light emitting element 1 described in Embodiment 1 and having the configuration shown in FIG. 1 was actually fabricated. An example of a fabrication method of the semiconductor light emitting element 1 will be described hereinbelow. FIGS. 4(A) and 4(B) are graphs each showing the surface roughness of each of the side faces of the semiconductor light emitting element of the present example. FIG. 5 is a view showing a conventional wafer, and a compound semiconductor layer and electrodes each formed on the wafer. FIGS. 6(A) and 6(B) are micrographs of the semiconductor light emitting element of the present example, and FIGS. 6(C) and 6(D) are micrographs of a conventional semiconductor light emitting element for comparison.

It is to be noted that the thickness, size, and the like of the semiconductor light emitting element 1 when it was fabricated are only exemplary, and are not limited to the following numerals. The thickness, size, and the like thereof can also be changed appropriately.

Although the following description primarily shows a growth method of a gallium nitride-based compound semiconductor using an organic metal vapor phase growth method, the growth method is not limited thereto. It is also possible to use a molecular beam epitaxy method, an organic metal molecular beam epitaxy method, or the like.

As the single crystal substrate serving as the substrate piece 2 after division, a wafer with a thickness of about 350 µm and a diameter of 2 inches (50.8 mm) which is made of gallium nitride having a hexagonal crystalline structure was used. The wafer was formed such that the lamination plane 20 on which the compound semiconductor layer was to be laminated was the (0001) plane, the surface thereof was mirror finished, and the OF surface 11 forms an angle θ of 15° with respect to the (1-100) plane which was the cleaved plane of the single crystal substrate.

After the single crystal substrate was placed on a substrate holder in a reaction vessel, cleaning for removing contamination, such as an organic material, and moisture each adhering to the surface of the single crystal substrate was performed by allowing a hydrogen gas, a nitrogen gas, and ammonia to flow at respective flow rates of 4 liter/minute, 4 liter/minute, and 2 liter/minute, while setting the temperature of the single crystal substrate to 1060° C., and holding the temperature for 10 minutes.

Then, the n-type semiconductor layer 31 made of GaN doped with Si was grown to a thickness of 2 µm by supplying ammonia, trimethyl gallium (hereinafter abbreviated as TMG), and monosilane diluted to 10 ppm at 2 liter/minute, 80 µmol/minute, and 10 cc/minute, respectively, while allowing a nitrogen gas and a hydrogen gas to flow as carrier gases at respective flow rates of 15 liter/minute and 4 liter/minute, and holding the temperature of the single crystal substrate at 1060° C. The electron concentration of the n-type semiconductor layer 31 was $1\times10^{18}$ cm$^{-3}$.

After the n-type semiconductor layer 31 was grown, the supply of monosilane was stopped, and a clad layer (not shown) made of undoped Al$_{0.05}$Ga$_{0.95}$N was grown to a thickness of 0.05 μm by supplying ammonia, TMG, and trimethyl aluminum (hereinafter abbreviated as TMA) at respective flow rates of 2 liter/minute, 40 μmol/minute, and 3 μmol/minute, while allowing a nitrogen gas and a hydrogen gas to flow as carrier gases at respective flow rates of 15 liter/minute and 4 liter/minute, and holding the temperature of the single crystal substrate at 1060° C. The electron concentration of the clad layer was $5\times10^{16}$ cm$^{-3}$.

After the clad layer was grown, the supply of TMG and TMA was stopped, and a quantum layer (not shown) of a quantum well structure made of undoped In$_{0.15}$Ga$_{0.85}$N was grown to a thickness of 2 nm by supplying nitrogen as a carrier gas, ammonia, TMQ and trimethyl indium (hereinafter abbreviated as TMI) at respective flow rates of 12 liter/minute, 8 liter/minute, 4 μmol/minute, and 5 μmol/minute, while reducing the temperature of the single crystal substrate to 700° C., and holding the temperature.

After the growth of the quantum layer, the supply of TMI was stopped, and a barrier layer (not shown) made of undoped GaN was grown to a thickness of 12 nm by supplying nitrogen as a carrier gas, ammonia, and TMG at respective flow rates of 12 liter/minute, 8 liter/minute, and 20 μmol/minute. Then, the supply of TMG was stopped, and a well layer (not shown), a barrier layer (not shown), a well layer (not shown), a barrier layer (not shown), and a well layer (not shown) were further formed by repeating the same procedure. That is, the four quantum layers and the three barrier layers were alternately laminated.

After the final quantum layer (not shown) was grown, the supply of TMI was stopped, and undoped Al$_{0.05}$Ga$_{0.95}$N (not shown) was grown in succession to a thickness of 3 nm by supplying nitrogen as a carrier gas, ammonia, TMG, and TMA at respective flow rates of 14 liter/minute, 6 liter/minute, 2 μmol/minute, and 0.15 μmol/minute, while increasing the temperature of the single crystal substrate toward 1060° C.

Then, the temperature of the single crystal substrate was increased and, when the temperature reached 1060° C., the p-type semiconductor layer 33 made of Al$_{0.05}$Ga$_{0.95}$N doped with Mg was grown to a thickness of 200 nm by supplying ammonia, TMQ, TMA, and biscyclopentadienyl magnesium (hereinafter abbreviated as Cp$_2$Mg) at respective flow rates of 2 liter/minute, 40 μmol/minute, 3 μmol/minute, and 0.1 μmol/minute, while allowing a nitrogen gas and a hydrogen gas to flow as carrier gases at respective flow rates of 15 liter/minute and 4 liter/minute. The Mg concentration of the p-type semiconductor layer 33 was $1\times10^{20}$ cm$^{-3}$.

After the p-type semiconductor layer 33 was grown, the supply of TMG, TMA, and Cp$_2$Mg was stopped, and the single crystal substrate was cooled to about a room temperature, while a nitrogen gas and ammonia were allowed to flow at respective flow rates of 8 liter/minute and 2 liter/minute, so that the wafer 10 in which the compound semiconductor layer 3 made of a gallium nitride-based compound semiconductor was laminated on the single crystal substrate was retrieved from the reaction vessel.

To the laminate structure made of the gallium nitride compound semiconductor 3 thus formed, annealing was not performed separately, and a SiO$_2$ film was deposited on the surface thereof by a CVD method. Thereafter, a SiO$_2$ mask for etching was patterned into a square shape with a side having a length of 0.8 mm by photolithography and wet etching.

Then, the surface of the n-type semiconductor layer 31 was exposed by partly removing each of the p-type semiconductor layer 33, the light emitting layer 32, the clad layer, and the n-type semiconductor layer 31 by a depth of about 500 nm in a direction reverse to the direction of lamination by a reactive ion etching method.

Then, by photolithography and a sputtering method, the n-electrode 4 which was a laminate of a contact layer made of Ti with a thickness of 100 nm and an n-side bonding layer made of Au with a thickness of 500 nm was formed on a part of the surface of the exposed n-type semiconductor layer 31. After the SiO$_2$ mask for etching was further removed by wet etching, the p-electrode 5 which was a laminate of a contact layer (not shown) made of Pt with a thickness of 3 nm, a reflection layer made of Rh with a thickness of 300 nm, and a p-side bonding layer made of Au with a thickness of 800 nm was formed on substantially the entire surface of the p-type semiconductor layer 33 by photolithography and a sputtering method.

In the three photolithographic steps mentioned above, a photomask patterned in a grid-like configuration was aligned with respect to the OF surface 11 so that the side faces of the rectangular light emitting element were parallel with or perpendicular to the OF surface 11. In this manner, the wafer 10 in which an etching pattern, and the arrangements of the n-electrodes 4 and the p-electrodes 5 were perpendicular to and parallel with the OF surface 11, as shown in FIG. 2, was obtained.

Thereafter, the thickness of the wafer 10 was adjusted to about 300 μm by polishing the plane of the wafer 10 opposite to the plane thereof on which the compound semiconductor layer 3 was laminated.

Then, using the laser scribe apparatus, split trenches each having a depth of 70 μm were formed in the plane of the wafer 10 opposite to the plane thereof on which the compound semiconductor layer 3 was laminated to extend perpendicularly to and in parallel with the OF surface 11. Then, the wafer 10 was divided along the scribe lines into pieces by applying a roller to the plane on which the compound semiconductor layer 3 was laminated, whereby the square semiconductor light emitting elements 1 each with a side having a length of 0.8 mm was obtained.

Since each of the semiconductor light emitting elements 1 thus obtained was formed such that the OF surface 11 forms an angle of 15° with respect to the (1-100) plane which was the cleaved plane of the single crystal substrate, each of the side faces thereof forms an angle of 15° with respect to the cleaved plane.

FIG. 4(A) shows the surface roughness of the side face 21 of the semiconductor light emitting element 1 forming an angle of 15° with respect to the (1-100) plane which is the cleaved plane. On the other hand, FIG. 4(B) shows the surface roughness of the side face 25 of the conventional semiconductor light emitting element as Comparative Example 1, which was fabricated by a conventional method wherein division was performed by forming an OF surface 12 in parallel with the (1-100) plane as the cleaved plane, and forming scribe trenches in directions perpendicular to and parallel with the OF surface 12, as shown in FIG. 5.

As can be seen from FIG. 4(A), extremely small concaves and convexes are formed in the side face 21 of the semiconductor light emitting element 1 of the present example which forms an angle of 15° with respect to the (1-100) plane as the cleaved plane.

By contrast, as can be seen from FIG. 4(B), the side face 25 of the semiconductor light emitting element of Comparative Example 1 which is parallel with the (1-100) plane as the cleaved plane is relatively flat and smooth compared with the side face 21 of FIG. 4(A), though it is a slightly rough surface with concaves and convexes.

The concave and convex conditions of the side faces 21 and 25 can also be observed with an optical microscope or the like. FIG. 6(A) is an optical micrograph of the side face 21 of the semiconductor light emitting element 1 of the present example which forms an angle of 15° with respective to the (1-100) plane as the cleaved plane shown in FIG. 2. FIG. 6(B) is an optical micrograph of the perpendicular side face 22 adjacent to the side face 21. It will be understood that concaves and convexes are formed across the entire surfaces of both of the side planes 21 and 22. This is because each of the side faces 21 and 22 is different in direction from any cleaved plane. Because the planes 23 and 24 are in the same directions as those of the planes 21 and 22, respectively, the concave and convex conditions are also the same.

FIG. 6(C) is an optical micrograph of the side plane 25 of the semiconductor light emitting element of Comparative Example 1 which is parallel with the (1-100) plane as the cleaved plane shown in FIG. 5. FIG. 6(D) is an optical micrograph of a vertical side plane 26 adjacent thereto. It will be understood that, because the side plane 26 is different in direction from the cleaved plane, concaves and convexes are formed therein in the same manner as in the side faces 21 and 22, while the side face 25 is a substantially flat and smooth face though a level difference has been locally produced.

Then, the semiconductor light emitting element according to the present example and the semiconductor light emitting element of Comparative Example 1 were connected onto submounts each composed of a Si diode via Au bumps by downwardly facing the planes thereof formed with the n-electrodes 4 and the p-electrodes 5. The submounts were placed on stems with an Ag paste, and molded with a transparent resin. When the semiconductor light emitting element according to the present example and the semiconductor light emitting element of Comparative Example 1 were each driven with a forward current of 350 mA, each of them emitted blue light with a peak emission wavelength of about 460 nm.

However, a difference was recognized between respective light emission outputs. As shown in FIG. 5, the light output of the semiconductor light emitting element of Comparative Example 1 which was divided as shown in FIG. 5 to have the side faces in directions parallel with cleaved planes was 201 mW. By contrast, as shown in FIG. 2, the light output of the semiconductor light emitting element 1 according to the present example which was formed by division such that all the side faces are composed of planes different from the cleaved planes as shown in FIG. 2 was 220 mW, which was about 10% higher than the light output of the semiconductor light emitting element having the side faces in the directions parallel with the cleaved planes.

Example 2

The semiconductor light emitting element 1' according to Embodiment 2 and having the configuration shown in FIG. 7 was actually fabricated. An example of a fabrication method of the semiconductor light emitting element 1' will be described hereinbelow.

Although the following description primarily shows a growth method of a gallium nitride-based compound semiconductor using an organic metal vapor phase growth method, the growth method is not limited thereto. It is also possible to use a molecular beam epitaxy method, an organic metal molecular beam epitaxy method, or the like.

For the single crystal substrate serving as the substrate piece 2' after division, a wafer in a square shape with a thickness of about 350 μm and a side of 10 mm which was made of gallium nitride having a hexagonal crystalline structure was used. The wafer was formed such that the lamination plane 20 on which the semiconductor layer was to be laminated was the a-plane, the surface thereof was mirror finished, and the OF surface 11' forms an angle θ of 45° with respect to the m-plane which was the cleaved plane of the single crystal substrate.

After the single crystal substrate was placed on a substrate holder in a reaction vessel, cleaning for removing contamination, such as an organic material, and moisture each adhering to the single crystal substrate was performed.

Then, the n-type semiconductor layer 31' made of GaN doped with Si, the MQW light emitting layer 32' obtained by alternately laminating an n-type clad layer (not shown) made of undoped $Al_{0.03}Ga_{0.97}N$, a quantum layer (not shown) of a quantum well structure made of undoped $In_{0.15}Ga_{0.85}N$, and a barrier layer (not shown) made of undoped GaN, and the p-type semiconductor layer 33' made of $Al_{0.03}Ga_{0.97}N$ doped with Mg were successively grown.

To the laminate structure made of the gallium nitride compound semiconductor 3' thus formed, annealing was not performed separately, and a $SiO_2$ film was deposited on the surface thereof by a CVD method. Thereafter, a $SiO_2$ mask for etching was patterned into a square shape with a side having a length of 1 mm by photolithography and wet etching. Then, the surface of the n-type semiconductor layer 31' was exposed by partly removing each of the p-type semiconductor layer 33', the light emitting layer 32', the clad layer, and the n-type semiconductor layer 31' in a direction reverse to the direction of lamination by a reactive ion etching method.

Then, by photolithography and a sputtering method, the n-electrode 4' which was a laminate of a contact layer made of Ti and an n-side bonding layer made of Au was formed on a part of the surface of the exposed n-type semiconductor layer 31. After the $SiO_2$ mask for etching was further removed by wet etching, the p-electrode 5' which was a laminate of a contact layer (not shown) made of Pt, a reflection layer made of Ag, a barrier layer made of Ti, and a p-side bonding layer made of Au was formed on substantially the entire surface of the p-type semiconductor layer 33' by photolithography and a sputtering method.

In the three photolithographic steps mentioned above, a photomask patterned in a grid-like configuration was aligned with respect to the OF surface 11' so that the side faces of the rectangular light emitting element were parallel with or perpendicular to the OF surface 11'. In this manner, the wafer 10' in which an etching pattern, and the arrangements of the n-electrodes 4' and the p-electrodes 5' were perpendicular to and parallel with the OF surface 11', as shown in FIG. 8, was obtained.

Thereafter, the thickness of the wafer 10' was adjusted to about 300 μm by polishing the plane of the wafer 10' opposite to the plane thereof on which the compound semiconductor layer 3' was laminated.

Then, using the laser scribe apparatus, split trenches each having a depth of 40 μm were formed in the plane of the wafer 10' opposite to the plane thereof on which the compound semiconductor layer 3' was laminated to extend perpendicularly to and in parallel with the OF surface 11'. Then, the wafer 10' was divided along the scribe lines into pieces by applying the cutter blade of a braking apparatus to the plane on which the compound semiconductor layer 3' was laminated in alignment with the positions of the split trenches, whereby the square semiconductor light emitting elements 1' each with a side having a length of 1 mm was obtained.

Since each of the semiconductor light emitting elements 1' thus obtained was formed such that the OF surface 11' forms an angle of 45° with respect to the m-plane which was the cleaved plane of the single crystal substrate 2', each of the side faces thereof forms an angle of 45° with respect to the cleaved plane.

FIG. 10(A) shows a schematic diagram of the concave and convex condition of the side face 21' of the semiconductor light emitting element 1' of the present example forming an angle of 45° with respect to the m-plane. On the other hand, FIG. 10(B) shows a schematic diagram of the concave and convex condition of the side face 25' of the conventional semiconductor light emitting element of Comparative Example 2, which was fabricated by a conventional method wherein division is performed by forming an OF surface 12' in parallel with the m-plane, and forming split trenches in directions perpendicular to and parallel with the OF surface 12', as shown in FIG. 11.

As can be seen from FIG. 10(A), extremely small concaves and convexes are formed in the side face 21' of the semiconductor light emitting element 1' of the present example. By contrast, as can be seen from FIG. 10(B), the side face 25' of the semiconductor light emitting element of Comparative Example 2 is relatively flat and smooth compared with the side face 21' of FIG. 10(A), though it is a slightly rough surface with concaves and convexes.

Then, theses semiconductor light emitting elements were connected onto submounts each composed of a Si diode via Au bumps by downwardly facing the respective planes thereof formed with the electrodes 4' and 5'. The submounts were each placed on stems with an Ag paste, and molded with a transparent resin. When the semiconductor light emitting elements were each driven with a forward current of 350 mA, each of them emitted blue light with a peak emission wavelength of 460 nm. However, a difference was recognized between respective light emission outputs. The light output of the semiconductor light emitting element of Comparative Example 2 was 137 mW. By contrast, the light output of the semiconductor light emitting element 1' of the present example was 158 mW, which was about 15% higher than the light output of the semiconductor light emitting element of Comparative Example 2 having the side faces in directions parallel with the cleaved planes.

INDUSTRIAL APPLICABILITY

In accordance with the present invention, it is possible to form concaves and convexes in the side faces of a semiconductor light emitting element, and improve light extraction efficiency without the need to add a new fabrication step. Therefore, the present invention is preferable for a semiconductor light emitting element formed by laminating a semiconductor layer on a translucent substrate, a wafer, or the like.

What is claimed is:

1. A semiconductor light emitting element formed by laminating a compound semiconductor layer on a single crystal substrate, and dividing the single crystal substrate into pieces, wherein
   the single crystal substrate has a hexagonal crystalline structure in which a (0001) plane is a lamination plane on which the compound semiconductor layer is laminated, and a (1-100) plane, a (0-110) plane, a (-1010) plane, a (-1100) plane, a (01-10) plane, and a (10-10) plane are cleavage planes,
   all side faces of each of substrate pieces as the divided single crystal substrate are formed of planes different from the cleavage planes of the single crystal substrate, and
   the lamination plane of the substrate piece is formed in a generally rectangular shape, and one side face of the substrate piece forms an angle of not less than 5° and not more than 25° with respect to any of the cleavage planes.

2. The semiconductor light emitting element of claim 1, wherein the lamination plane of the substrate piece is formed in a generally rectangular shape, and one side face of the substrate piece forms an angle of not less than 10° and not more than 20° with respect to any of the cleavage planes.

3. The semiconductor light emitting element of claim 1, wherein the single crystal substrate is formed of any of a gallium nitride-based compound semiconductor, a zinc oxide-based compound semiconductor, a silicon carbide compound semiconductor, and an aluminum nitride-based compound semiconductor.

4. The semiconductor light emitting element of claim 1, wherein the compound semiconductor layer laminated on the single crystal substrate is formed of any of a gallium nitride-based compound semiconductor, a zinc oxide-based compound semiconductor, and an aluminum nitride-based compound semiconductor.

\* \* \* \* \*